US009198280B2

(12) United States Patent
Biddle et al.

(10) Patent No.: US 9,198,280 B2
(45) Date of Patent: Nov. 24, 2015

(54) VIA STRUCTURE FOR TRANSMITTING DIFFERENTIAL SIGNALS

(75) Inventors: Gary Ellsworth Biddle, Carlisle, PA (US); James Nadolny, Mechanicsburg, PA (US)

(73) Assignee: Samtec, Inc., New Albany, IN (US)

(*) Notice: Subject to any disclaimer, the term of this patent is extended or adjusted under 35 U.S.C. 154(b) by 330 days.

(21) Appl. No.: 13/607,281

(22) Filed: Sep. 7, 2012

(65) Prior Publication Data

US 2013/0056253 A1 Mar. 7, 2013

Related U.S. Application Data

(60) Provisional application No. 61/531,714, filed on Sep. 7, 2011.

(51) Int. Cl.
*H05K 1/11* (2006.01)
*H05K 1/02* (2006.01)
*H05K 3/40* (2006.01)

(52) U.S. Cl.
CPC ............ *H05K 1/0245* (2013.01); *H05K 1/0251* (2013.01); *H05K 3/4015* (2013.01)

(58) Field of Classification Search
CPC ................... H05K 1/0228; H05K 2201/0792; H05K 1/0216; H05K 1/0245; H05K 1/024; H01L 23/49838
USPC .................................................... 174/26–266
See application file for complete search history.

(56) References Cited

U.S. PATENT DOCUMENTS

| 5,815,374 | A | * | 9/1998 | Howell ......................... 361/768 |
| 6,384,341 | B1 | | 5/2002 | Rothermel et al. |
| 7,358,752 | B1 | | 4/2008 | Ramroopsingh et al. |
| 7,405,477 | B1 | * | 7/2008 | Tao et al. ...................... 257/728 |
| 7,705,246 | B1 | * | 4/2010 | Pritchard et al. ............. 174/262 |
| 2004/0007386 | A1 | | 1/2004 | Tsou et al. |
| 2004/0150970 | A1 | * | 8/2004 | Lee ................................ 361/794 |
| 2005/0201065 | A1 | | 9/2005 | Regnier et al. |

(Continued)

FOREIGN PATENT DOCUMENTS

JP 2004-055894 A 2/2004
KR 10-2001-0109729 A 12/2001

OTHER PUBLICATIONS

Official Communication issued in International Patent Application No. PCT/US2012/054301, mailed on Feb. 20, 2013.

(Continued)

*Primary Examiner* — Steven T Sawyer
(74) *Attorney, Agent, or Firm* — Keating & Bennett, LLP

(57) ABSTRACT

A printed circuit board includes first and second signal pads located on a top surface of the printed circuit board and arranged to transmit a first differential signal, first and second signal vias extending through the printed circuit board and arranged to transmit the first differential signal, a first signal trace located on the top surface of the printed circuit board and connecting the first signal pad and the first signal via, and a second signal trace located on the top surface of the printed circuit board and connecting the second signal pad and the second signal via. The first and second signal vias are located on opposite sides of a line connecting the first and second signal pads.

18 Claims, 17 Drawing Sheets

(56) References Cited

U.S. PATENT DOCUMENTS

| | | | |
|---|---|---|---|
| 2006/0091545 A1* | 5/2006 | Casher et al. | 257/738 |
| 2006/0185890 A1* | 8/2006 | Robinson | 174/255 |
| 2006/0227522 A1* | 10/2006 | Huang et al. | 361/782 |
| 2007/0119615 A1* | 5/2007 | Kobayashi | 174/250 |
| 2010/0044093 A1* | 2/2010 | Moazzami et al. | 174/264 |
| 2010/0048043 A1 | 2/2010 | Morlion et al. | |

OTHER PUBLICATIONS

Gary Ellsworth Biddle et al., "Via Structure for Transmitting Differential Signals," U.S. Appl. No. 13/607,298, filed Sep. 7, 2012.

Gary Ellsworth Biddle et al., "Via Structure for Transmitting Differential Signals," U.S. Appl. No. 13/607,338, filed Sep. 7, 2012.

* cited by examiner

VIA STRUCTURE FOR TRANSMITTING DIFFERENTIAL SIGNALS

U.S. applications Ser. Nos. 13/607,298 and 13/607,338 filed on Sep. 7, 2012 are directed to similar subject matter as this application and are incorporated by reference in their entireties.

BACKGROUND OF THE INVENTION

1. Field of the Invention

The present invention relates to a via structure of a printed circuit board (PCB). More specifically, the present invention relates to the via structure of a PCB for transmitting differential signals.

2. Description of the Related Art

It is known to use differential signaling to transmit information. Differential signaling uses two complementary signals that are sent on two paired transmission lines, e.g. contacts, wires, or traces. These paired transmission lines are referred to as differential pairs, and the complementary signals are referred to as differential signals. The differential signals are typically transmitted through a connector and a PCB. In the connector, the differential signals are transmitted through an array of contacts. The array of contacts is connected to an array of vias within the PCB. The arrangement of the array of vias is similar to the arrangement of the array of contacts. The PCB includes a break out region (BOR) in which the differential signals are routed to different portions of the PCB. Typically, multiple layers of the PCB are used in the BOR so that the differential signals can be routed on different layers of the PCB.

FIG. 16 shows a plan view of a known footprint of a PCB 110. The footprint shows the vias 101 arranged in an array with 50 mils×50 mils (1.27 mm×1.27 mm) (where mils is equal to one thousandths of an inch and mm is millimeters) pitch, where adjacent vias 101 are spaced 50 mils apart in both the top-to-bottom and left-to-right directions. The vias 101 are connected to corresponding contacts 102 of a connector (not shown in FIG. 17) with solder 103 as shown in FIG. 17. For simplicity, only a portion of the contacts 102 is shown FIG. 17. This specification uses the convention that for reference numbers that include reference numbers without letters and the same reference number with letters that the reference number without a letter, e.g. 102, refers to all corresponding elements, e.g. all contacts, while the reference numbers with letters, e.g. 102a, 102b, 102g, refer to specific elements, e.g. contacts 102a, 102b, 102g as shown in FIG. 17. The contacts 102 are arranged in a similar array as the vias 101. FIG. 17 only shows a portion (a four-by-four array) of the array of vias 101 and contacts 102 shown in FIG. 16.

FIGS. 17 and 22 show that the width of the channels available for routing the traces 105b o between the vias 101 in the BOR is limited to 50 mils minus the via plated through hole (PTH) size, which limits the possible trace routing options in the BOR.

In FIG. 17, contacts 102a, 102b are paired contacts that transmit complimentary signals, i.e. contacts 102a, 102b are a differential pair. Ground contacts 102g are arranged around contacts 102a to improve signal integrity of the differential signal transmitted through the contacts 102a, 102b by, for example, shielding the contacts 102a, 102b from adjacent differential pairs.

FIGS. 18 and 19 show another conventional via structure in which the contacts 102 are connected to pads 108 by solder 103. The contacts 102 are electrically connected to the vias 101 by traces 105. Each of the vias 101 includes an annular ring 104 that is connected to the corresponding trace 105.

The prior art via structures described above fail to include a single central axis of signal propagation through the transition from the connector to the PCB. As seen in, for example, FIG. 21, the central axis of signal propagation through the contacts 102 of the connector is different from the central axis of signal propagation through the vias 101. This difference in the central axes is determined by the traces 105. The central axis of signal propagation through the two contacts 102a, 102b of a differential pair is in the center between the two contacts 102a, 102b. Similarly, the central axis of signal propagation through the vias 101a, 101b of a differential pair is in the center between the two vias 101a, 101b. The central axes are offset from each other by the length and direction of the traces 105, which is typically 36 mils for a 50 mils pitch. Further, the prior art via structures lack angular symmetry with respect to the top ground plane layer and lack preferential coupling between the vias of the differential signals because the cross term coupling factors are evenly distributed. The failure to include a single central axis of signal propagation, the lack of angular symmetry, and the lack of preferential coupling negatively affect signal integrity.

In FIG. 18, because the antipad 107 (i.e., holes or portions where the ground plane 106 is not located) of the ground plane 106 encircles only the vias 101a, 101b and does not encompass the pads 108a, 108b and traces 105a, 105b when viewed in plan view, the capacitive coupling between the pads 108a, 108b, traces 105a, 105b, and the ground plane 106 is increased. Too much capacitive coupling can cause a drop in the time-domain reflectometer (TDR) impedance profile, which can cause the signal to be reflected back and not transmitted. If the size of the antipad 107 was increased to remove the ground plane 106 from underneath the pads 108, then the larger antipad 107 would increase crosstalk and affect the impedance profile. Also, as the signal speed increases, larger antipads 107 can cause the signal to change propagation modes around the antipads 107, which can further cause signal loss and reflections.

As shown in FIG. 20, each ground contact 102g is connected to a corresponding ground via 101g, which increases costs because each ground via 101g connected to a ground contact 102g must be drilled.

SUMMARY OF THE INVENTION

To overcome the problems described above, preferred embodiments of the present invention provide a via structure that can be used in high-density, high-speed connector applications that require high-performance PCB breakout designs to enable full utilization of the connector's utility. The preferred embodiments of the present invention offer significant performance benefits with respect to crosstalk and insertion loss, which extends the upper high-frequency operating range for high-density small-pitch applications.

A printed circuit board according to a preferred embodiment of the present invention includes first and second signal pads located on a top surface of the printed circuit board and arranged to transmit a first differential signal, first and second signal vias extending through the printed circuit board and arranged to transmit the first differential signal, a first signal trace located on the top surface of the printed circuit board and connecting the first signal pad and the first signal via, and a second signal trace located on the top surface of the printed circuit board and connecting the second signal pad and the second signal via. The first and second signal vias are located on opposite sides of a line connecting the first and second signal pads.

The first and second signal vias are preferably located on a centerline between the first and second signal pads. The first and second signal vias are preferably offset from a centerline between the first and second signal pads.

The printed circuit board further preferably includes third and fourth signal vias extending through the printed circuit board and arranged to transmit a second differential signal, where there are preferably no ground vias located between a first centerline between the first and second signal pads and a second centerline between the third and fourth signal pads and where the first and second centerlines preferably do not overlap.

The printed circuit board further preferably includes first and second breakout traces connected to the first and second signal vias and located on a layer within the printed circuit board and between the first and second centerlines when viewed in plan. The printed circuit board further preferably includes a ground planelocated on a layer below the top surface of the printed circuit board and including an antipad that encompasses the first and second signal pads and the first and second signal vias when viewed in plan.

The printed circuit board further preferably includes first, second, third, and fourth ground pads located on the top surface of the printed circuit board and arranged to provide ground, first and second ground vias extending through the printed circuit board and arranged to provide ground, a first ground trace located on the top surface of the printed circuit board and connecting the first and second ground pads, and a second ground trace located on the top surface of the printed circuit board and connecting the third and fourth ground pads. The first and second ground vias are preferably located on a centerline between the first and second signal pads. The first and second ground vias and the first and second signal vias are preferably located on a centerline between the first and second signal pads.

The first and second signal vias are preferably arranged such that the first differential signal when transmitted through the first and second signal vias has a central axis.

An electrical system according to a preferred embodiment of the present invention preferably includes a printed circuit board as discussed above and a connector including first and second signal contacts arranged to transmit the first differential signal. The first signal contact is preferably connected to the first signal pad, and the second signal contact is preferably connected to the second signal pad.

The first and second signal vias are preferably located on a centerline between the first and second signal pads. The first and second signal vias are preferably offset from a centerline between the first and second signal pads.

The printed circuit board further preferably includes third and fourth signal vias extending through the printed circuit board and arranged to transmit a second differential signal, and the connector further preferably includes third and fourth signal contacts arranged to transmit the second differential signal, where there are preferably no ground vias located between a first centerline between the first and second signal pads and a second centerline between the third and fourth signal pads, where the first and second centerlines preferably do not overlap, where the third signal contact is preferably connected to the third signal pad, and where the fourth signal contact is preferably connected to the fourth signal pad.

The printed circuit board further preferably includes first and second breakout traces connected to the first and second signal vias and located on a layer within the printed circuit board and between the first and second centerlines when viewed in plan. The printed circuit board further preferably includes a ground plane located on a layer below the top surface of the printed circuit board and including an antipad that encompasses the first and second signal pads and the first and second signal vias when viewed in plan.

The printed circuit board further preferably includes first, second, third, and fourth ground pads located on the top surface of the printed circuit board and arranged to provide ground, first and second ground vias extending through the printed circuit board and arranged to provide ground, a first ground trace located on the top surface of the printed circuit board and connecting the first and second ground pads, and a second ground trace located on the top surface of the printed circuit board and connecting the third and fourth ground pads. The connector further preferably includes first, second, third, and fourth ground contacts arranged to provide ground. The first ground contact is preferably connected to the first ground pad. The second ground contact is preferably connected to the second ground pad. The third ground contact is preferably connected to the third ground pad. The fourth ground contact is preferably connected to the fourth ground pad. The first and second ground vias are preferably located on a centerline between the first and second signal pads. The first and second ground vias and the first and second signal vias are preferably located on a centerline between the first and second signal pads.

The first and second signal vias and the first and second signal contacts are preferably arranged such that the first differential signal when transmitted through the first and second signal vias and the first differential signal when transmitted through the first and second signal contacts share a common central axis.

The above and other features, elements, characteristics and advantages of the present invention will become more apparent from the following detailed description of preferred embodiments of the present invention with reference to the attached drawings.

DETAILED DESCRIPTION OF PREFERRED EMBODIMENTS

FIGS. 1-15 and 23A-25 show preferred embodiments of the present invention. FIGS. 1-15 show via structures according to various preferred embodiments of the present invention. FIGS. 23A-25 show a connector connected to via structure according to a preferred embodiment of the present invention.

Figure 1:
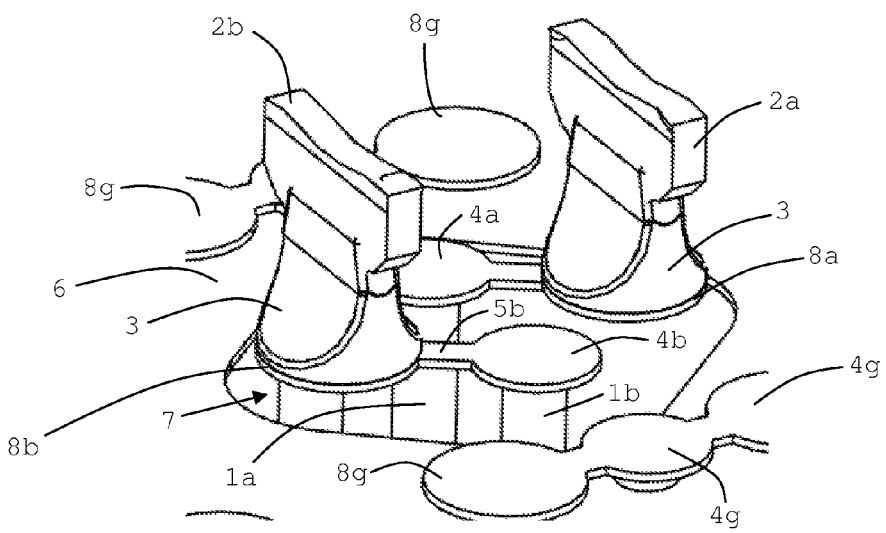
FIG. 1 is a close-up view of a differential pair of contacts and vias according to a preferred embodiment of the present invention.
Figure 2:
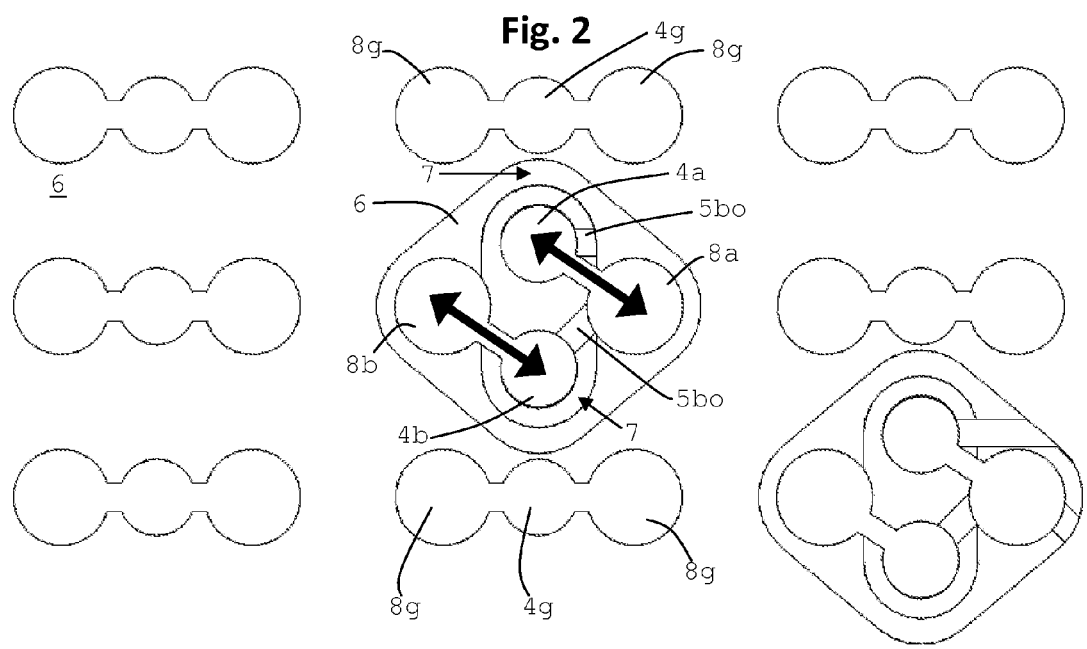
FIG. 2 is a top plan view of a portion of an array of contacts and vias including a differential pair of contacts and vias according to a preferred embodiment of the present invention.
Figure 3:
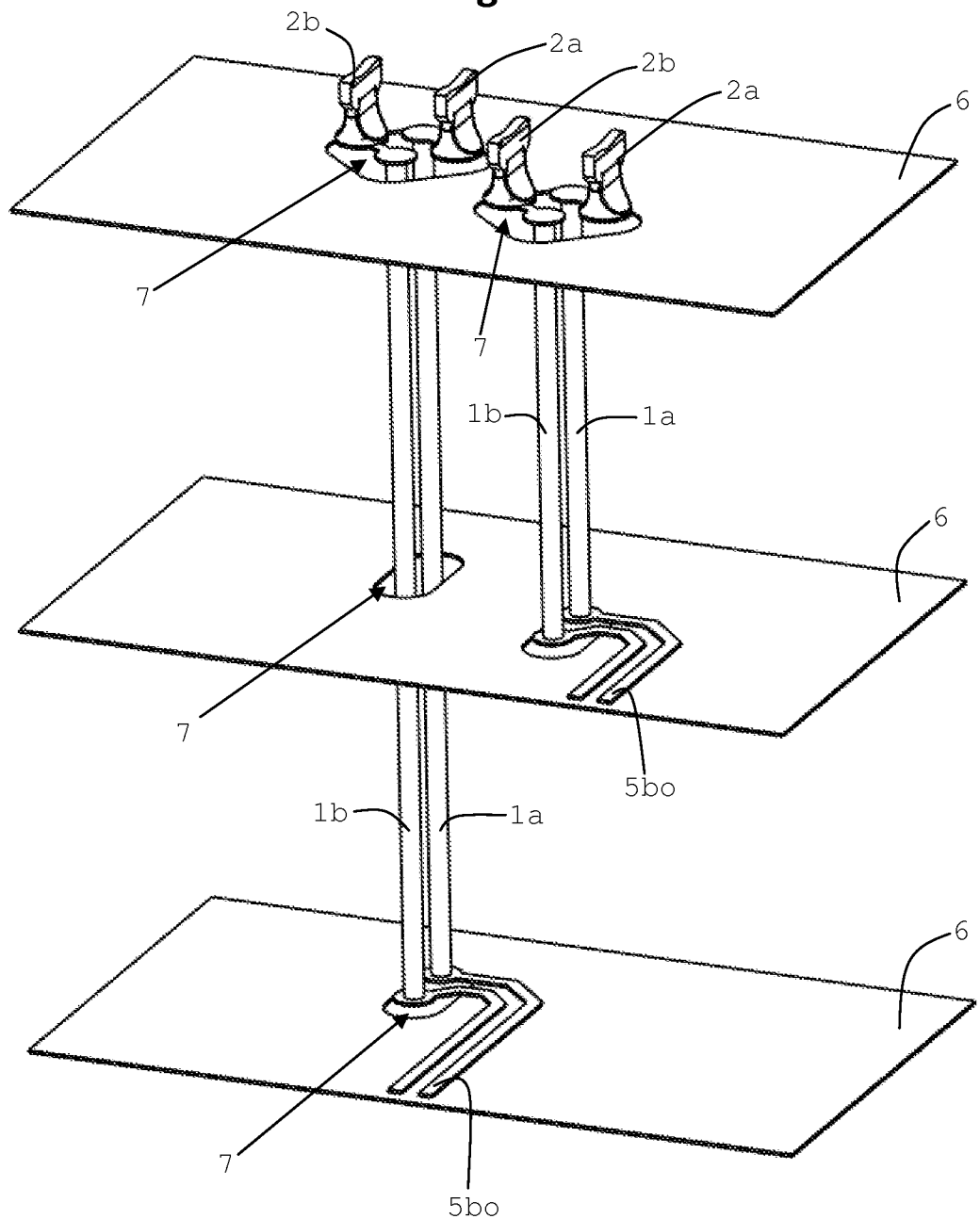
FIG. 3 is a top perspective view of a portion of an array of vias including a differential pair of vias according to a preferred embodiment of the present invention.

FIG. 1 is a close-up view of contacts $2a$, $2b$ that are arranged as a differential pair. FIG. 2 is a plan view of a six-by-three array of pads 8, in which contacts $8a$, $8b$ are surrounded by contacts $8g$. In FIGS. 1 and 2, as well as some of the other figures, certain elements or features are left-out for illustrative purposes. For example, only the conductive portions of the PCB are shown in FIGS. 1 and 2, while the dielectric portions (e.g., layers of FR-4 or other suitable dielectric materials) are not shown. In addition, some the elements or features are exaggerated in some of the figures. For example, the distance between the ground planes 6 in FIG. 3 is exaggerated so that BOR can be easily seen.

Figure 23A:
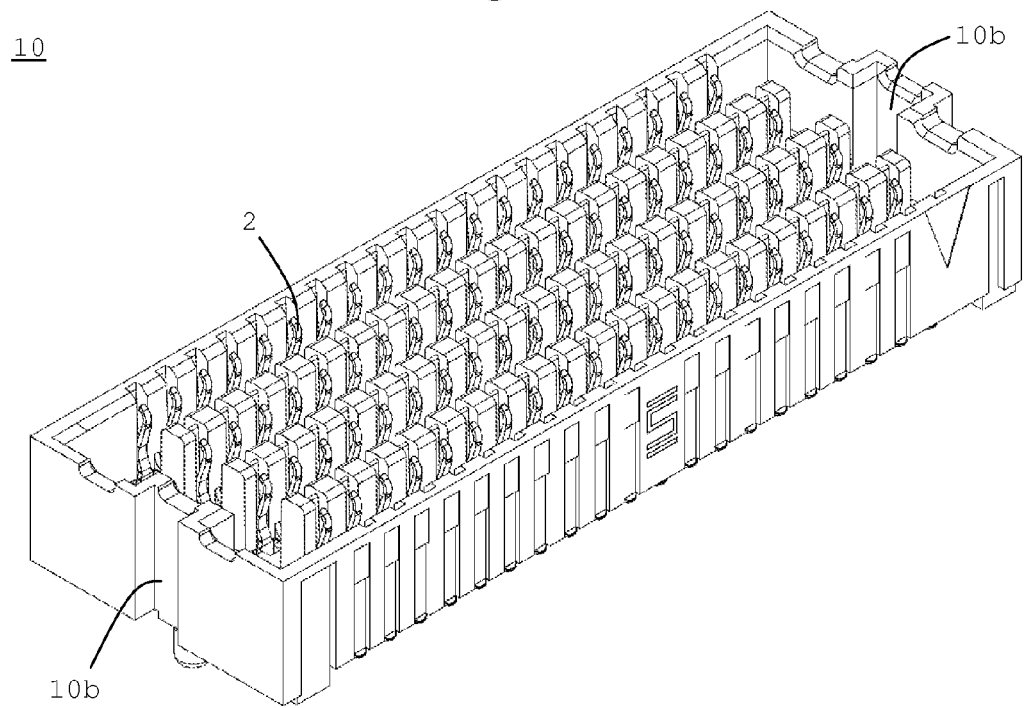
FIGS. 23A and 23B are top and bottom perspective views of a connector according to a preferred embodiment of the present invention.
Figure 23B:
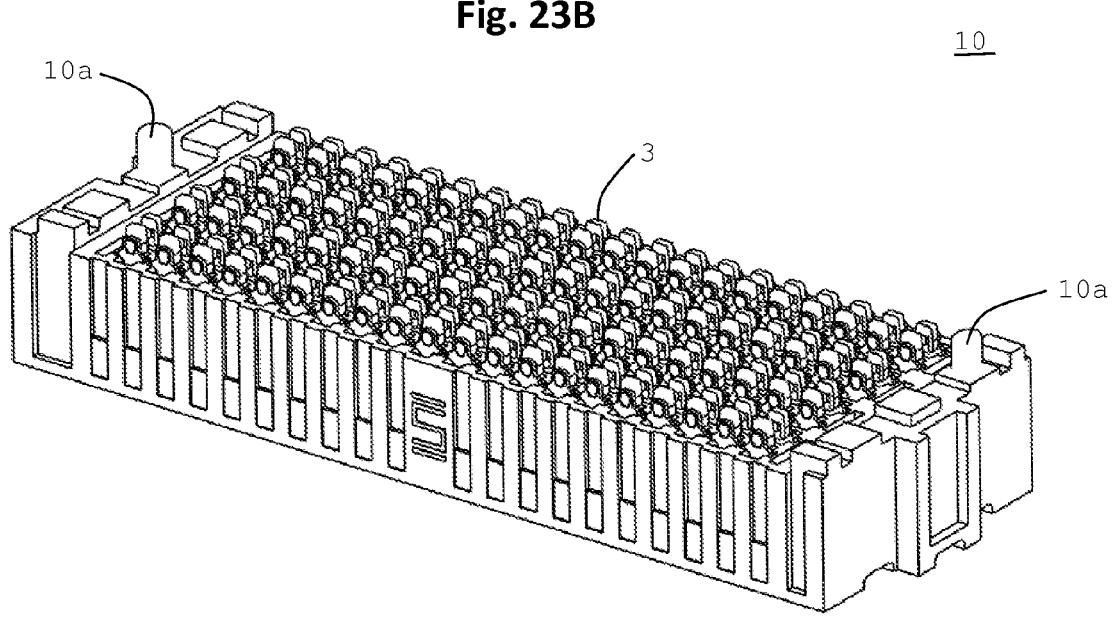

For simplicity, FIG. 1 only partially shows the contacts $2a$, $2b$. Any suitable contact can be used for contacts $2a$, $2b$, including those shown, for example, in FIG. 4. The contacts $2a$, $2b$ are included in a connector 10 (not shown in FIGS. 1 and 2, but an example of which is shown in FIGS. 23A and 23B). Typically, a connector 10 includes an array of contacts 2 that are arranged to correspond to an array of pads 8 as shown in FIG. 2. Any number of rows and columns can be used in the arrays of contacts 2 and pads 8. The arrays of contacts 2 and pads 8 are preferably regular in that the distance between adjacent rows is the same distance as the distance between adjacent columns, i.e. the horizontal pitch is the same as the vertical pitch. However, it is possible to use arrays in which these distances are not the same, i.e., the horizontal pitch and the vertical pitch are not the same.

In the array of contacts 2 and pads 8, different pinout assignments can be used. That is, each contact 2 and pad 8 can be assigned to a differential signal pair or to ground. It is also possible that some of the contacts 2 and pads 8 are not assigned to a differential signal pair or to ground. For example, some contact 2 and pads 8 could be assigned to singled-ended signals, power, or not assigned at all. To provide preferred pinout assignments, optimal horizontal and high-density are preferably used as discussed below. It is possible for a portion of the array of contacts 2 and pads 8 to be assigned to the optimal horizontal pinout and for another portion of the array of contacts and pads to be assigned to the high-density pinout.

In FIG. 1, the contacts $2a$, $2b$ are connected to pads $8a$, $8b$ preferably by solder 3. The solder 3 can be provided by solder balls, crimped solder, or solder charges, for example. Further, instead of using solder arranged in a BGA, it is also possible to use pins that are arranged in a pin grid array (PGA). The pads $8a$, $8b$ are connected to annular rings $4a$, $4b$ of the vias $1a$, $1b$ by traces $5a$, $5b$.

As seen in FIG. 1, the vias $1a$, $1b$ are arranged on opposite sides of a line connecting contacts $2a$, $2b$ and are preferably arranged along a centerline between the contacts $2a$, $2b$. However, as discussed below with respect to FIG. 12, it is possible that the vias $1a$, $1b$ are offset from the centerline between the contacts $2a$, $2b$ so as not to be exactly aligned along the centerline. The vias $1a$, $1b$ are preferably arranged such that the distance between vias $1a$, $1b$ is the same as the distance between the contacts $2a$, $2b$, which, when looking in plan view, would place the contacts $2a$, $2b$ and the vias $1a$, $1b$ on the corners of a square. However, instead of a square, it is possible that the contacts $2a$, $2b$ and the vias $1a$, $1b$ are placed on the corners of rhombus or other suitable shape.

The top layer of the PCB includes a conductive layer, which is typically copper but could be any suitable conductive material, that includes the annular rings 4, traces 5, and pads 8. The annular rings 4, traces 5, and pads 8 can be formed at the same time or at different times. As explained above, the vias 1 and the contacts 2 are connected by annular rings 4, traces 5, and pads 8. The length of a signal's propagation path in the vertical direction, i.e. perpendicular to the surface of the PCB, is quite small compared to the length of a signal's propagation path in the horizontal direction, i.e. parallel to the surface of the PCB.

The ground plane 6 shown in, for example, FIGS. 1 and 2 is located below the plane containing the annular rings 4, pads 8, and traces 5. Only one ground plane 6 can be seen in FIG. 1, while two ground planes 6 can be seen in FIG. 2, where the bottom ground plane 6 can be seen through the antipad 7 in the top ground plane 6. The ground planes 6 preferably include antipads 7 that surround the vias 1a, 1b. Any number of ground planes 6, including zero and more than two, can be used. FIG. 2 shows two different antipads 7 that are located within the two ground planes 6. The top antipad 7 is located closest to the surface of the PCB and to the annular rings 4a, 4b, pads 8a, 8b, and traces 5a, 5b; surrounds the vias 1a, 1b; and is large enough to encompass the annular rings 4a, 4b, pads 8a, 8b, and traces 5a, 5b when viewed in plan view. The bottom antipad 7 surrounds the vias 1a, 1b but preferably is not large enough to encompass the annular rings 4a, 4b, pads 8a, 8b, and traces 5a, 5b when viewed in plan view. Because the vias 1a, 1b and the contacts 2a, 2b are arranged around the same central axis 9 (shown in FIGS. 6 and 7), it is possible to provide the smallest antipad 7 to reduce the capacitive coupling between the annular rings 4a, 4b, pads 8a, 8b, and traces 5a, 5b and the top ground plane 6. Because the capacitive coupling is reduced, the low impedance discontinuity at the top ground layer 6 is reduced.

Figure 15:
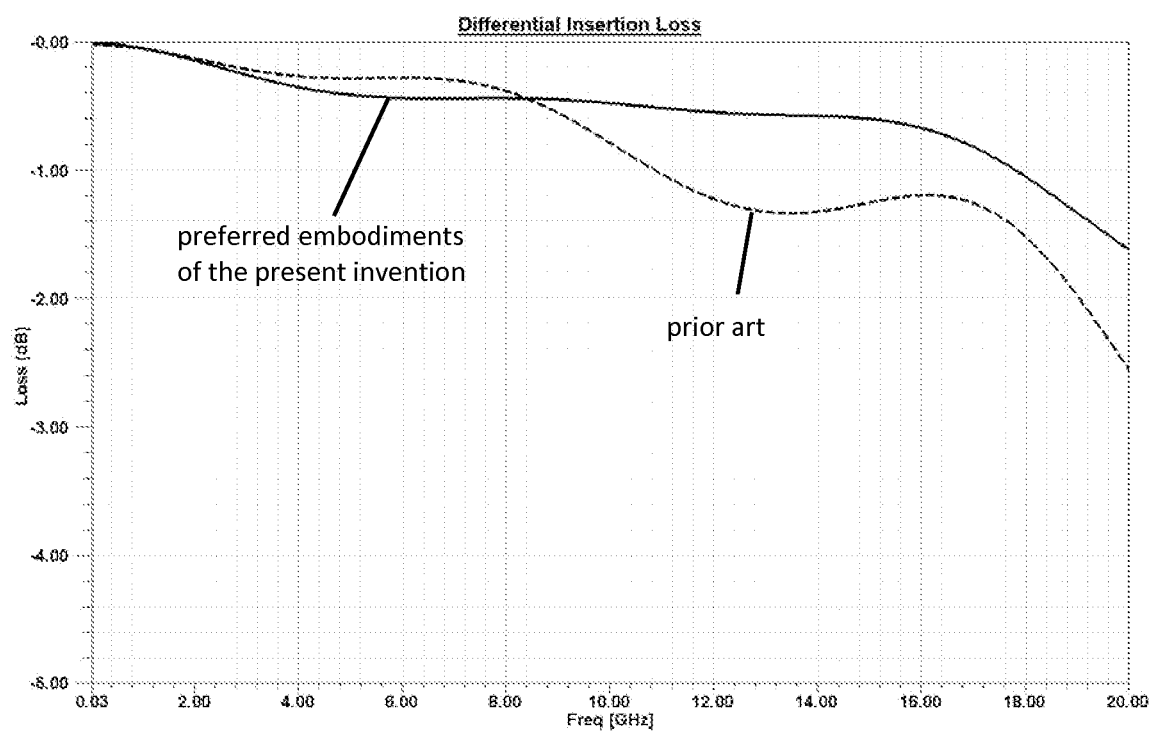
FIG. 15 is a graph comparing the differential insertion loss (IL) versus frequency of the via structure of FIG. 8 of the preferred embodiments of the present invention with the via structure of FIG. 22 of the prior art.
Figure 16:
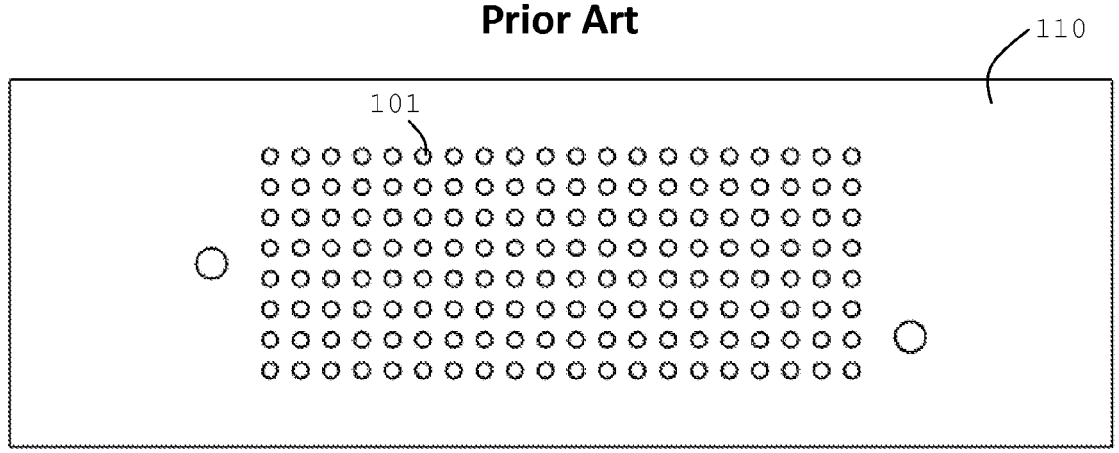
FIG. 16 is a top plan view of a prior art footprint.

It is preferable to provide the smallest-possible symmetrically-shaped antipads 7; however, any size and shape of antipad 7 can be used. The size and shape of the antipad 7 can be used to adjust the TDR impedance profile of signals transmitted through the connector and the PCB. Because the antipad 7 can be located directly below the signal contacts 2a, 2b, it is possible to provide a symmetrically shaped antipad 7 with respect to the contacts 2a, 2b, which is not possible with the conventional arrangement as shown, for example, in . The combination of a common central axis 9 and a symmetrical minimally-sized antipad 7 enhances the signal integrity. The Differential Insertion Loss graph of FIG. 15 shows significantly better performance for the preferred embodiments of the present invention over the prior art at high frequencies.

As seen by the arrows in FIG. 2, the traces 5a, 5b are arranged to connect the annular rings 4a, 4b and pads 8a, 8b such that the differential signals propagating through the vias 1a, 1b share the same central axis 9 (shown in FIGS. 6 and 7) as the differential signals propagating through the contacts 2a, 2b. This arrangement of traces effectively creates a transmission line structure that has a symmetrical 90° twist around the central axis 9 of propagation with a symmetrically-shaped minimally-sized antipad 7 to encompass both the annular rings 4a, 4b and the pads 8a, 8b, compared to the conventional structure which has no common centerline, has two 90° turns, is not symmetric, and requires larger antipads.

Figure 4:
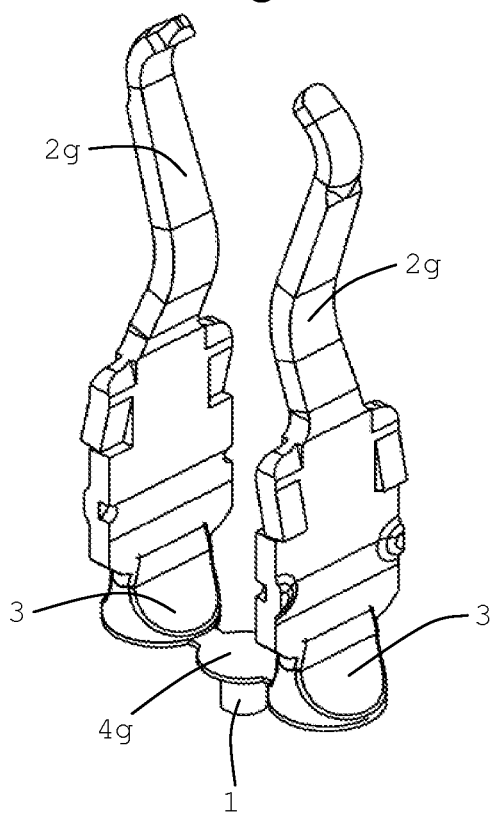
FIG. 4 is a perspective of a pair of ground contacts according to a preferred embodiment of the present invention.

As shown in FIG. 4, two contacts 2g are preferably connected to the same ground via 1g. Connecting two ground contacts 2g to a single ground via 1g reduces the number of holes that need to be formed in the PCB, which reduces costs. Further, connecting two ground contacts 2g to a single ground via 1g in combination with arranging the vias 1a, 1b along a centerline between the contacts 2a, 2b, increases the size of the channels between adjacent rows of vias 1 in the PCB. As seen in FIG. 2, the ground vias 1g are located on the centerline between the signal vias 1a, 1b on the left and on the centerline of between the signal vias 1a, 1b on the right so that there are no ground vias between the two centerlines.

Figure 5:
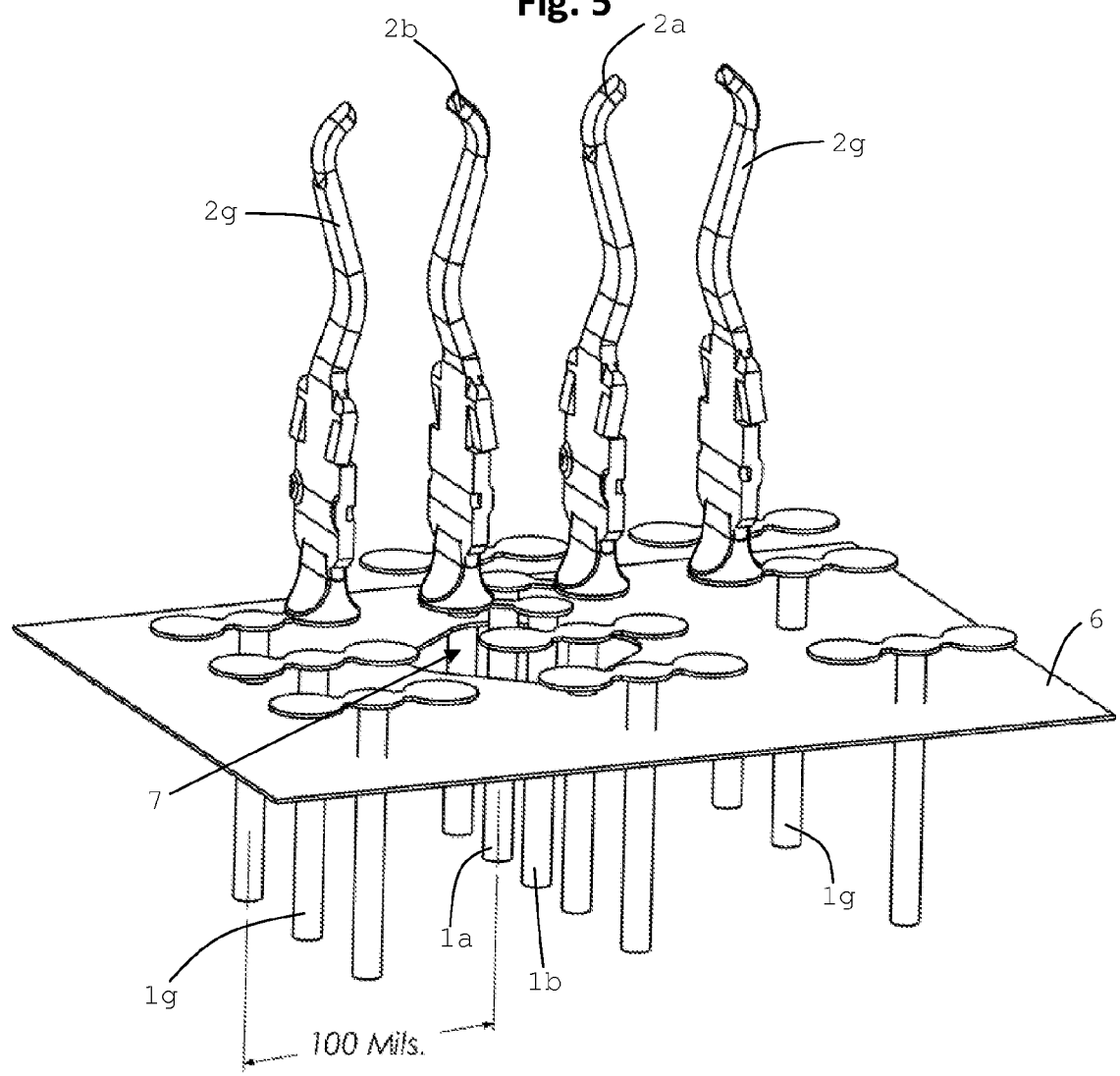
FIG. 5 is a side perspective view of a portion of an array of contacts and vias including a differential pair of contacts and vias according to a preferred embodiment of the present invention.
Figure 8:
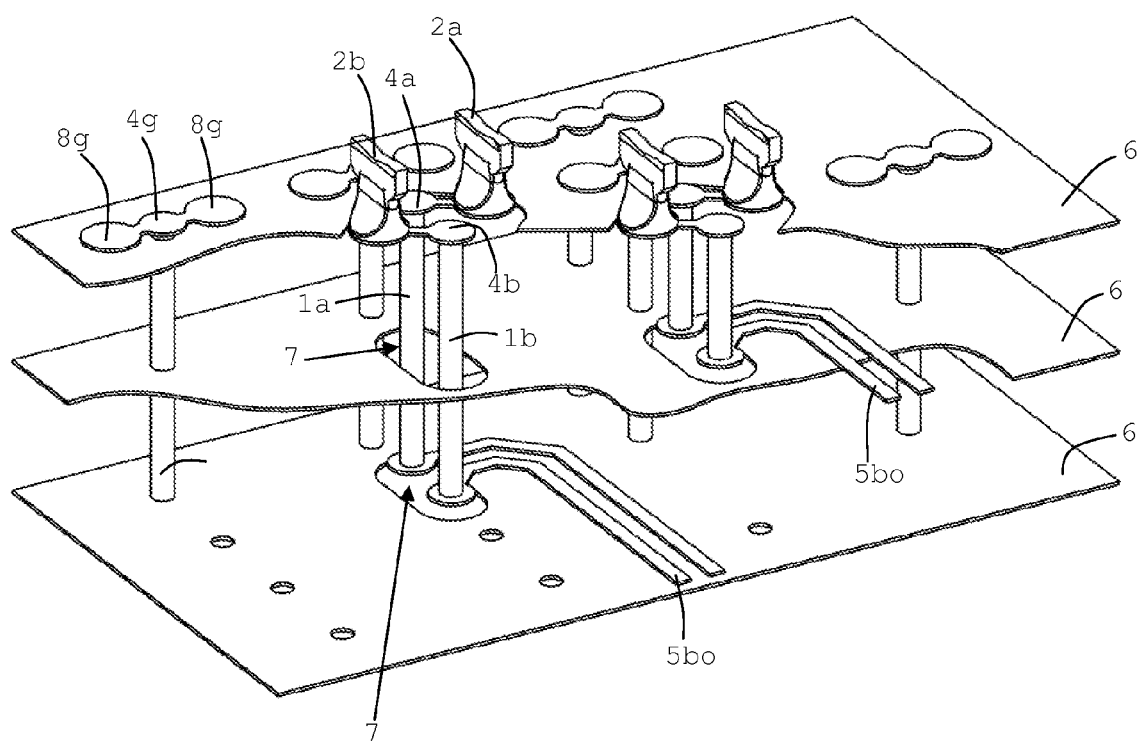
FIG. 8 is a perspective view of an array of contacts and vias including differential pairs of contacts and vias according to a preferred embodiment of the present invention.
Figure 18:
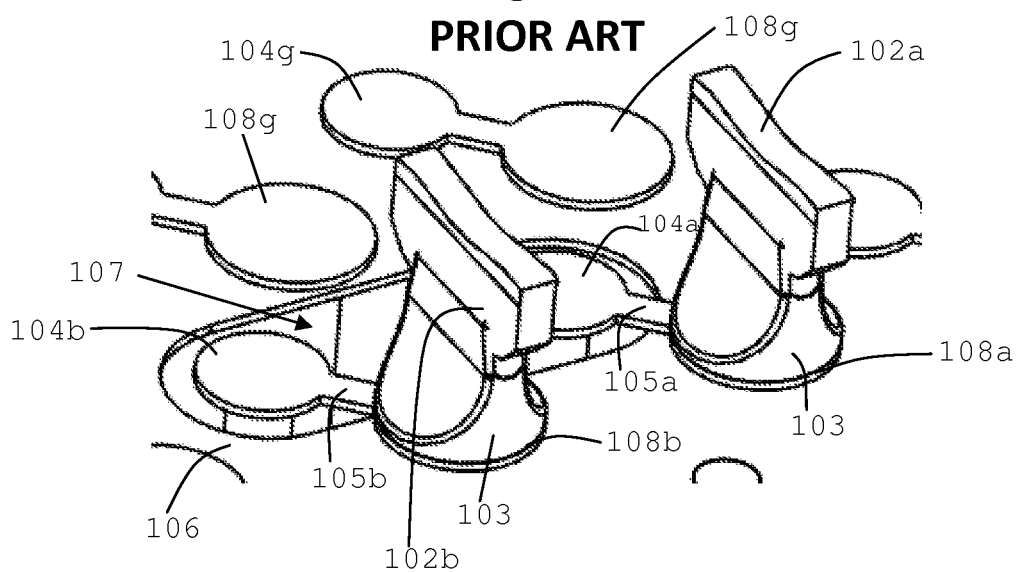
FIG. 18 is a close-up view of a differential pair of contacts and vias according to a prior art arrangement.

As shown in the FIGS. 5 and 8, the width of the channels available for routing traces 5bo between the vias 1 is about 100 mils minus PTH, which is about twice as large as the widths of the channels shown in FIG. 18. The increased width of the channels increases the trace routing options. In addition to increasing the trace routing options, the increased width between adjacent rows of signal vias 1a, 1b increases the isolation between adjacent differential pairs.

Although connecting two ground contacts 2g to a single ground via 1g can slightly increase the self-inductance from the top ground layer to BGA pads, it is possible to offset the slight increase in self-inductance for the following reasons. The effective length of the ground vias 1g is typically very short, about 4 mil, for example, which reduces the negative effects caused by the increased self-inductance. The ground vias 1g typically extend through the PCB from top to bottom and are typically connected to every groundplane the ground vias 1g extend through. However, because the ground via 1g is connected to the ground plane 6 closest to the top of the PCB, the effective length of the ground via 1g is the distance between the top of the PCB and the ground plane 6 closest to the top of the PCB, which is about 4 mil. It is possible to decrease the self-inductance of the one ground via 1g by enlarging the diameter of the one ground via 1g. Preferred embodiments of the present invention use one ground via 1g for two ground contacts 2g, which reduces the number of ground vias 1g extending through the PCB. Because the number of ground vias 1g is reduced, trace routing in the BOR is made easier because more space is made available for trace routing. As discussed above, replacing two ground vias 1g with one ground via 1g with a larger diameter can compensate for changes in the self-inductance. In addition, the optimal horizontal pinout allocates an additional connector contact for ground, which lowers the self-inductance. The overall self-inductance can be improved because the addition of the additional signal contact 1a, 1b lowers the overall self-inductance many times compared to the slight increase in self-inductance created by connecting the two ground contacts 2g to a single ground via 1g.

Connecting two contacts 2g to the same ground via 1g reduces the number of thermal paths. The heat sinks defined by the ground pads 8g compared to the heat sinks defined by the pads 8a, 8b will be slightly more alike. The signal pads 8a, 8b are attached to vias 1a, 1b that have internal traces as their heat sink. The ground pads 8g are attached to ground planes 6 with more copper mass, i.e., more thermal mass. The temperature rise of the ground pads 8g, including any solder, should be slower than the signal pads 8a, 8b because they are attached to a larger thermal mass. By connecting the two ground pads 8g to one via 1g, the resistance to thermal conductivity is increased, allowing the ground pads 8g to move a little closer to the signal pad 8a, 8b temperature rise curve.

Figure 17:
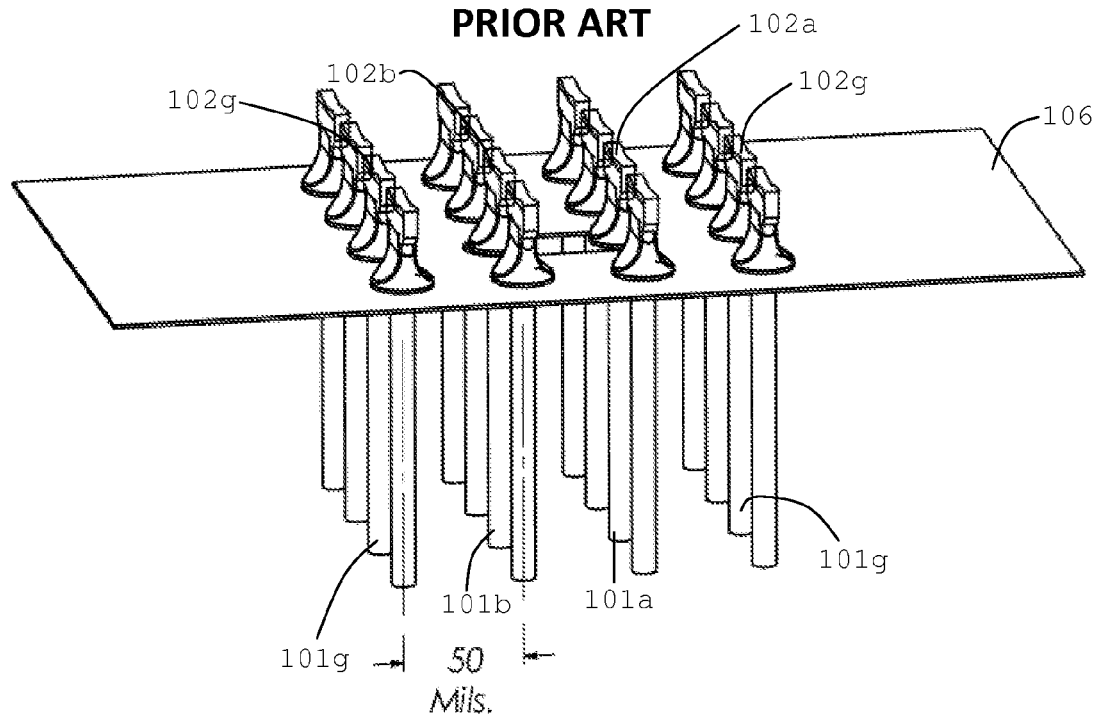
FIG. 17 is a side perspective view of an array of contacts and vias according to a prior art arrangement.

Preferably, the single ground via 1g connected to the two ground contacts 2g is arranged along the centerline between the two contacts 2a, 2b as shown, for example, in FIGS. 1 and 2. This arrangement creates a 4-inline via arrangement: ground via 1g, signal via 2a, signal via 2b, and ground via 1g (G-S-S-G). The 4-inline via arrangement tightly couples the differential signals propagated within the signal vias 1a, 1b. Removing 50% of the ground vias 1g by connecting two ground contacts 2g to the same ground via 1g reduces some of the capacitive coupling between the signal vias 1a, 1b and the ground vias 1g. The reduction of the capacitive coupling enables an increase in the capacitive coupling within signal vias 1a, 1b of the 4-inline via arrangement, maintains an acceptable TDR impedance profile, and focuses the propagating signal in a smaller space, i.e., between the signal vias 1a, 1b. In addition, by approximately doubling the distance between the centerlines of adjacent pairs of signal vias 1a, 1b, electrical isolation is provided and significantly increased between adjacent pairs of signal vias 1a, 1b, which more than compensates for the ground via shielding loss from the 50% reduction in ground vias 1g. The distance between the centerlines of adjacent pairs of signal vias 1a, 1b is typically about 100 mils as shown in FIG. 5 for a connector with 50-mil-by-50-mil pitch spacing, which is twice the conventional 50 mil distance shown in FIG. 17 also for a connector with 50-mil-by-50-mil pitch spacing.

Figure 12:
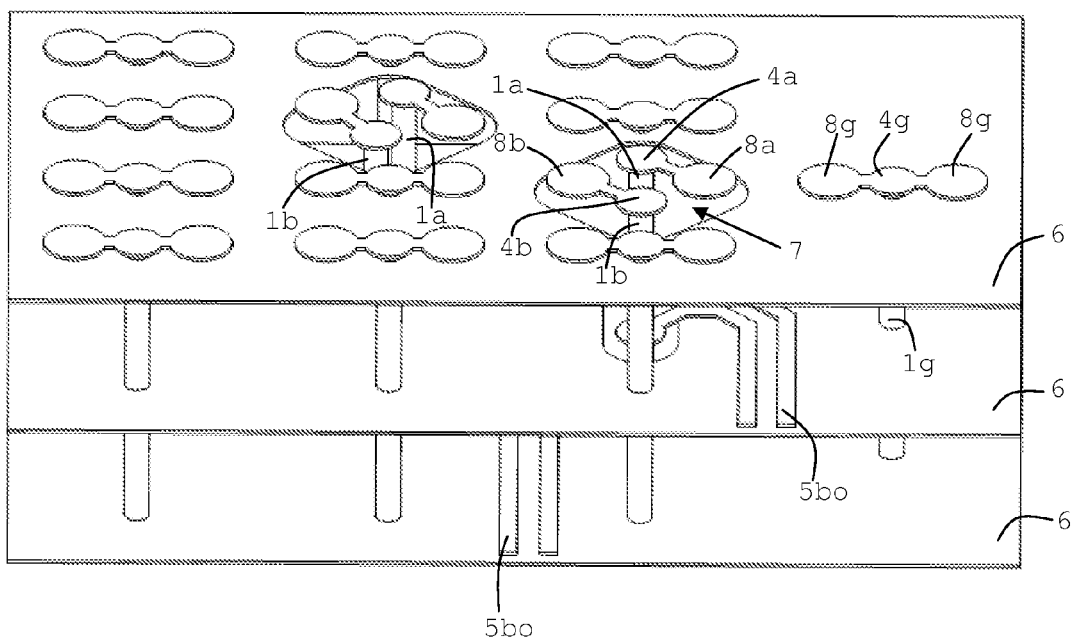
FIG. 12 is a perspective of yet another array of an array of contacts and vias including differential pairs of contacts and vias according to a preferred embodiment of the present invention.

As shown in FIG. 12, it also possible to offset the signal vias 1a, 1b from the centerline between the contacts 2a, 2b. Offsetting allows for longer distances between the drill holes for forming the signal vias 1a, 1b and thus allows for greater density for signal vias 1a, 1b with those distances, while also achieving improved signal integrity advantages as previously discussed. The maximum offset of the vias 1a, 1b would be equal to half of the connector pitch, at which point the distance between vias would be at the original routing channel width. Any further offset would make signal integrity worse.

Figure 19:
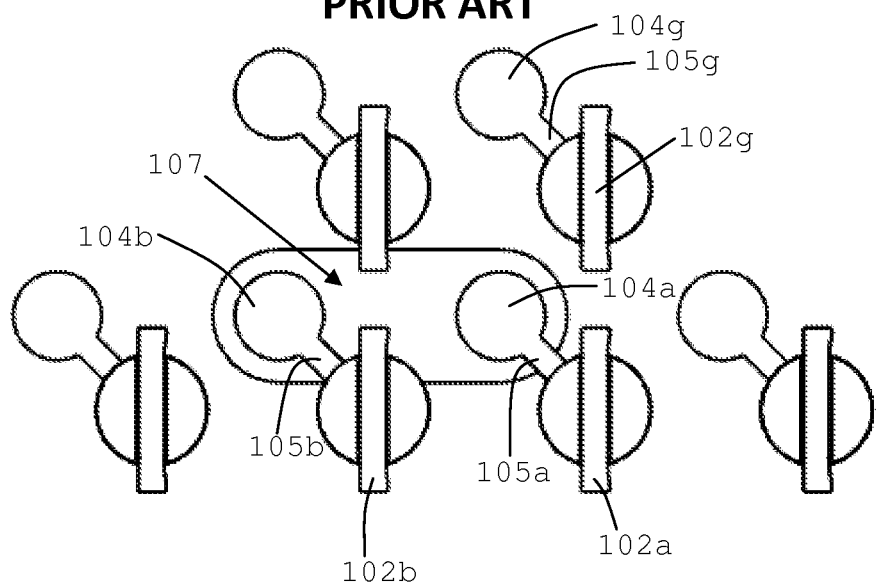
FIG. 19 is a top plan view of an array of contacts and vias including differential pairs of contacts and vias according to a prior art arrangement.
Figure 20:
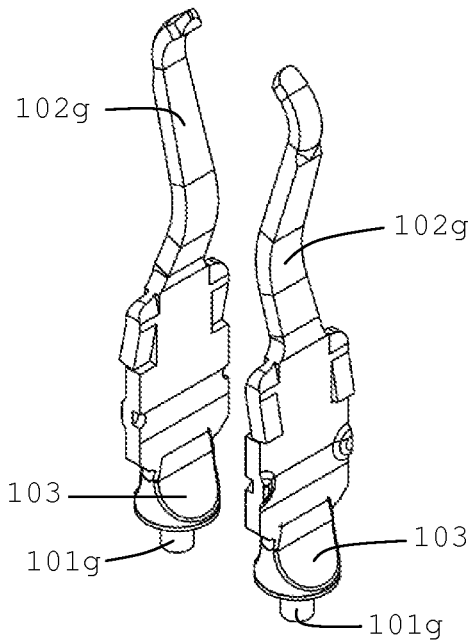
FIG. 20 is a perspective of a pair of ground contacts according to a prior art arrangement.
Figure 21:
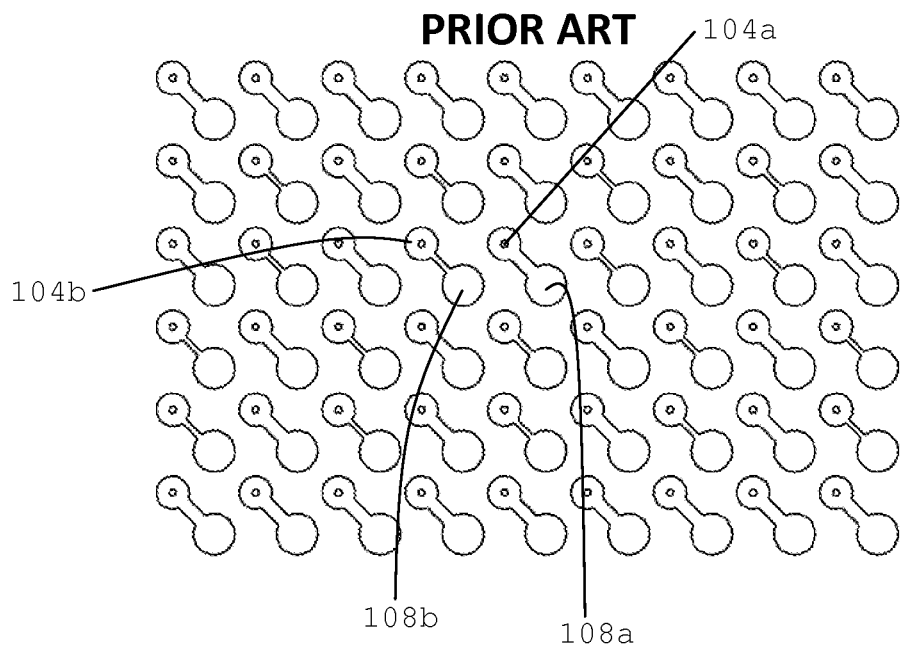
FIG. 21 is a top plan view of another prior art footprint.
Figure 22:
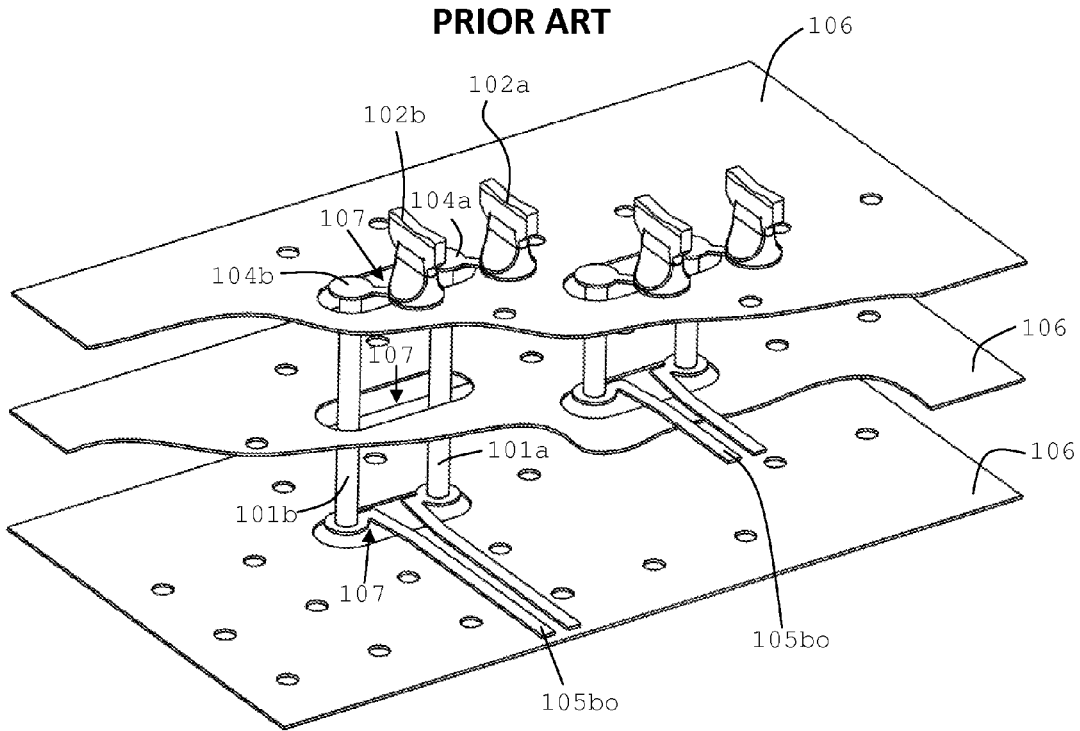
FIG. 22 is a perspective view of an array of contacts and vias including differential pairs of contacts and vias according to a prior art arrangement.

As seen, for example, in FIGS. 3 and 8, the vias 1a, 1b of a differential pair are located much closer to each other than the vias 1a, 1b of an adjacent differential pair. The vias 1a, 1b of adjacent differential pairs of the preferred embodiments of the present invention are located even farther apart than the vias 101 of adjacent differential pairs shown in, for example, FIGS. 19 and 22. This increased distance between vias 1a, 1b of adjacent differential pairs provides improved isolation between adjacent differential pairs. The vias 1a, 1b also provide an improved transition between the PCB and the connector by providing a central axis 9 (shown in FIGS. 6 and 7) along which the differential signals propagate. This via structure provides the tightest signal coupling between the vias 1a, 1b of a differential pair and the largest spatial separation between adjacent differential pairs for best-case isolation.

Figure 13:
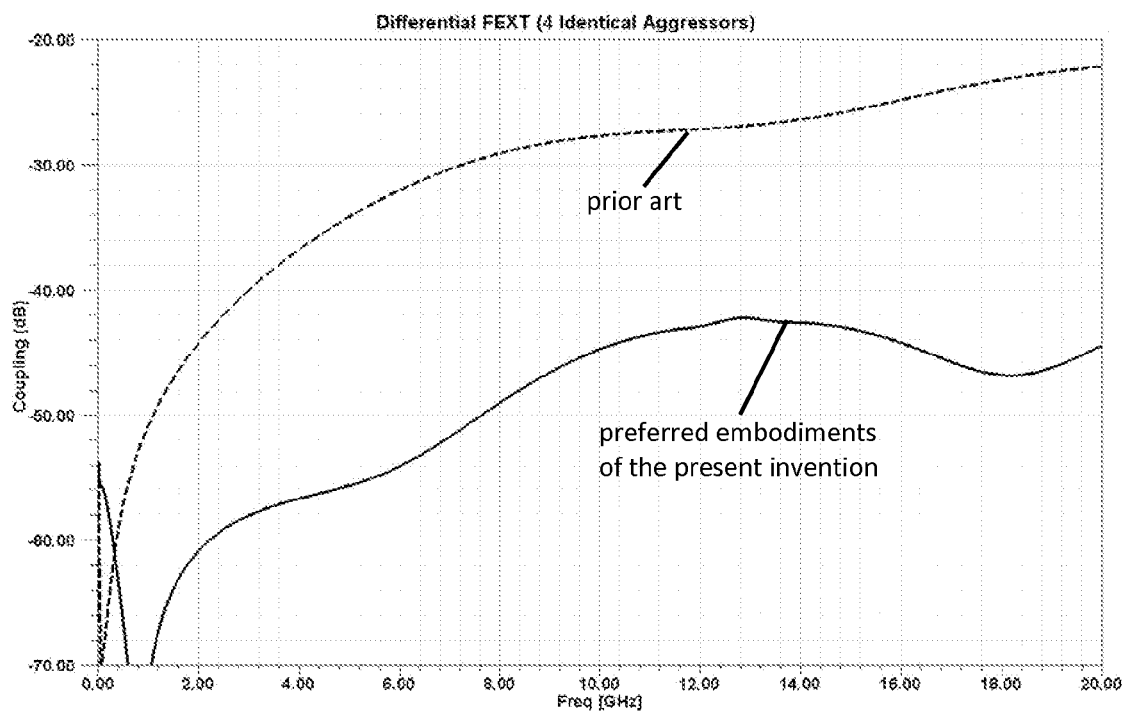
FIG. 13 is a graph comparing the far end crosstalk (FEXT) versus frequency of the via structure of FIG. 8 of the preferred embodiments of the present invention with the via structure of FIG. 22 of the prior art.
Figure 14:
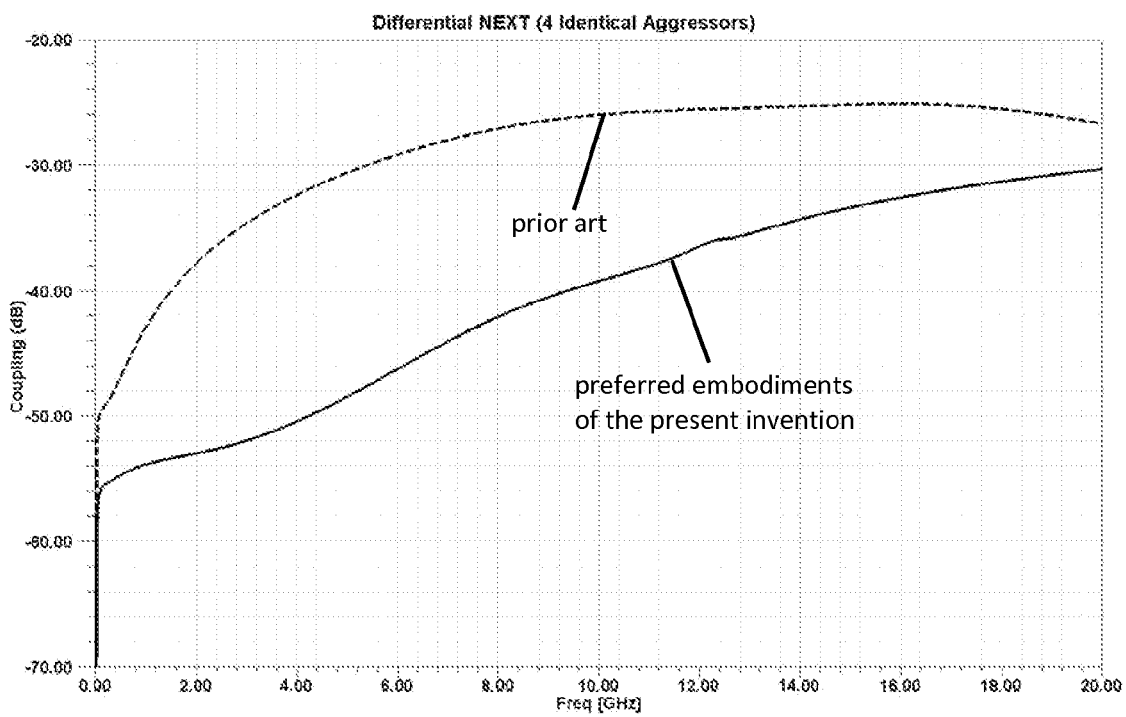
FIG. 14 is a graph comparing the near end crosstalk (NEXT) versus frequency of the via structure of FIG. 8 of the preferred embodiments of the present invention with the via structure of FIG. 22 of the prior art.

The via structure according to preferred embodiments of the present invention can reduce the crosstalk between adjacent differential pairs. FIGS. 13 and 14 are graphs comparing the near end crosstalk (NEXT) and far end crosstalk (FEXT) of the via structure of the preferred embodiments shown, for example, in FIG. 8 with the via structure of the prior art shown, for example, in FIG. 22. HFSS models of the PCB BOR shown in FIGS. 8 and 22 needed for a connector were used to create FIGS. 13 and 14. The graphs of FIGS. 13 and 14 were created using worse-case multiple aggressor crosstalk analysis using four aggressors and one victim for the optimal horizontal pinout, which includes a ground contact 2g for every signal contact 2a or 2b and which is industry preferred. FIGS. 13 and 14 show significant reduction in crosstalk for the via structure according to the preferred embodiments compared to the via structure of the prior art, with up to about 20 dB reduction in crosstalk for most of the shown frequency range.

Figure 11:
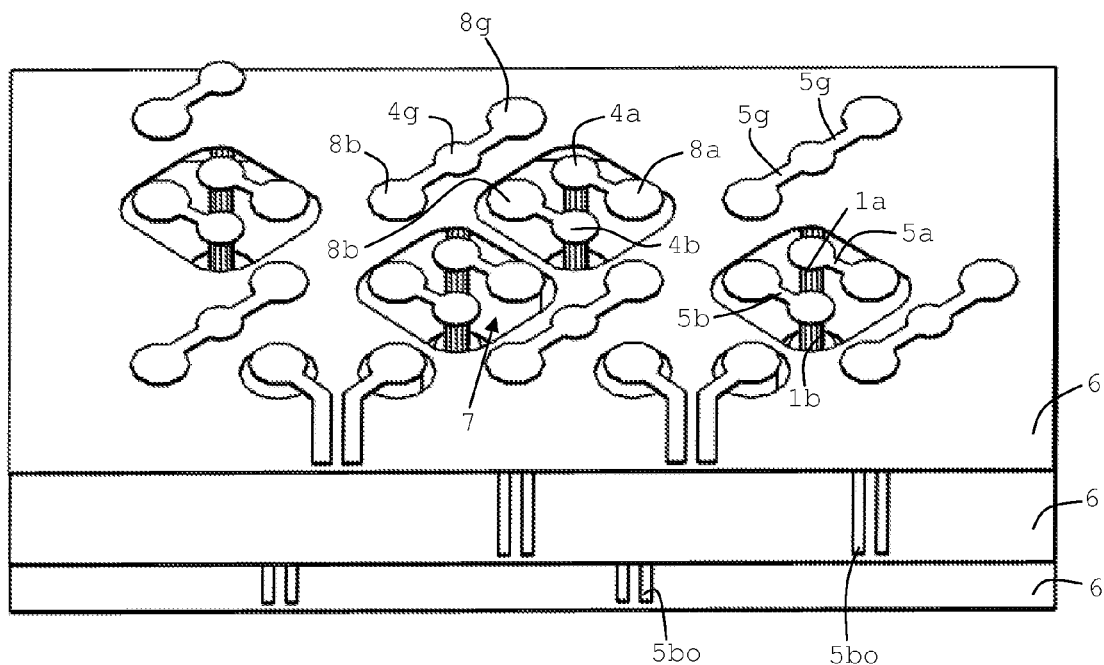
FIG. 11 is a perspective of another array of an array of contacts and vias including differential pairs of contacts and vias according to a preferred embodiment of the present invention.

Instead of using the optimal horizontal pinout in which every signal contact 2a or 2b includes a corresponding ground contact 2g, it is possible to use other pinouts. For example, as shown in FIG. 11, it is possible to use a high-density pinout which includes a ground contact 2g for every pair of signal contacts 2a, 2b. Because each pair of signal contacts 2a, 2b is associated with only one ground contacts 2g, it is possible to achieve a higher density of pairs of signal contacts 2a, 2b.

Figure 6:
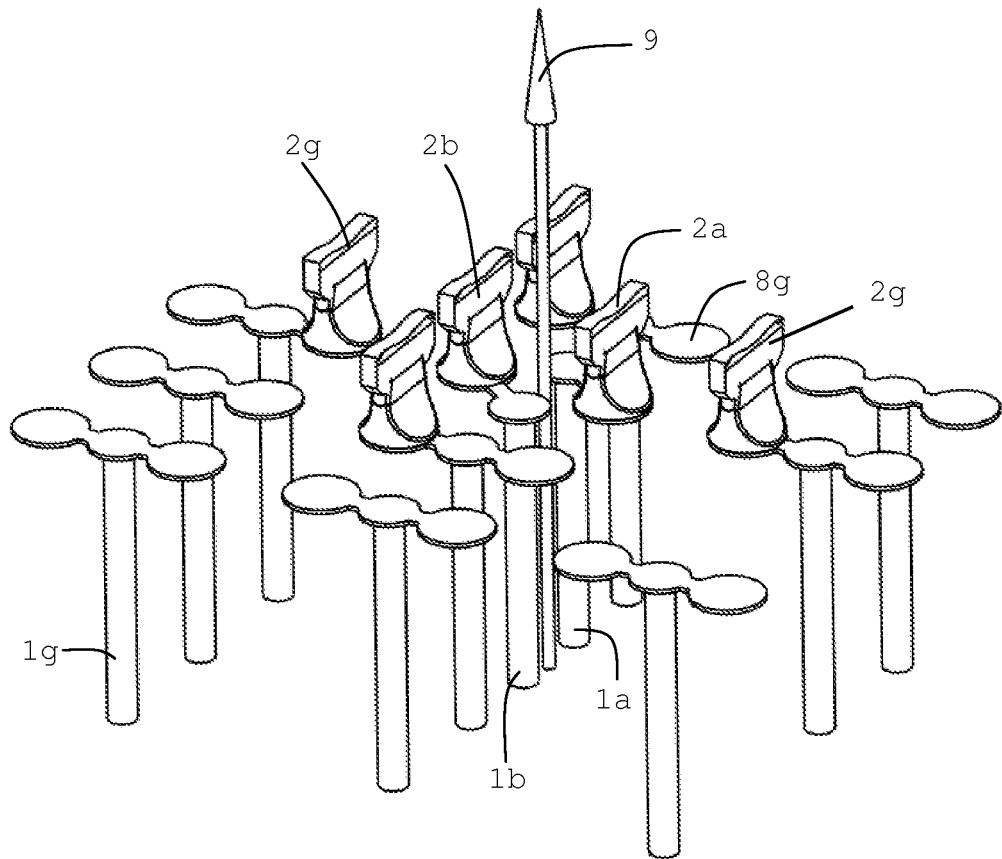
FIG. 6 is another side perspective view of a portion of an array of contacts and vias including a differential pair of contacts and vias according to a preferred embodiment of the present invention.
Figure 7:
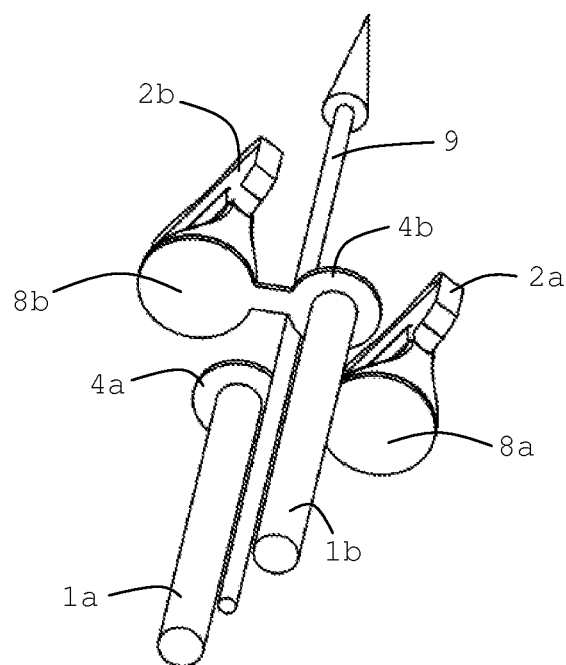
FIG. 7 is another bottom perspective view of a differential pair of contacts and vias according to a preferred embodiment of the present invention.

As shown in FIGS. 6 and 7, the differential signal transmitted through the contacts 2a, 2b and the vias 1a, 1b have a common central axis 9 and have angular symmetry about this central axis 9. Having the same central axis in the vias 1a, 1b as the contacts 2a, 2b is achieved by routing the traces 5a, 5b (only trace 5b can be seen in FIG. 7 is labeled) in opposite directions, as seen by the two arrows in FIG. 2. The traces 5a, 5b create a 90° twist of the transmitted differential signal around the central axis 9. This 90° twist occurs in the plane including the annular rings 4, the traces 5, and pads 8, which is typically approximately 0.03 mm thick, for example. The differential signals are coupled, not only in the vias 1a, 1b and contact 2a, 2b, but also in the traces 5a, 5b.

Figure 9:
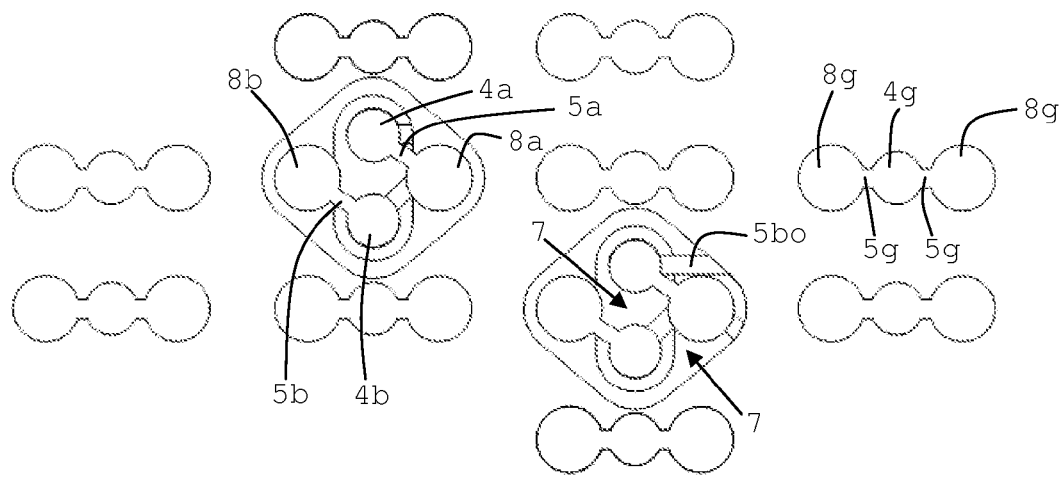
FIG. 9 is a top plan view of a portion of a two-row array of vias including differential pairs of contacts according to a preferred embodiment of the present invention.

FIG. 9 shows a via structure for a connector with only two rows of contacts. FIG. 9 shows an arrangement in which two extra rows of ground vias 1g (top and bottom) are added so that a 4-inline via arrangement can be achieved. That is, the 4-inline via arrangement is achieved by grouping signal contacts 2a, 2b in one row of contacts with a pair of ground contacts 2g in the opposing row of contacts and with either the top or bottom extra row of vias 1g opposite to the opposing row of contacts, creating the G-S-S-G via structure. In FIG. 9, ground pads 8g are included in the extra rows of ground vias 1g; however, it is possible to not use grounds pads 8g and to only use the ground vias 1g.

Figure 10:
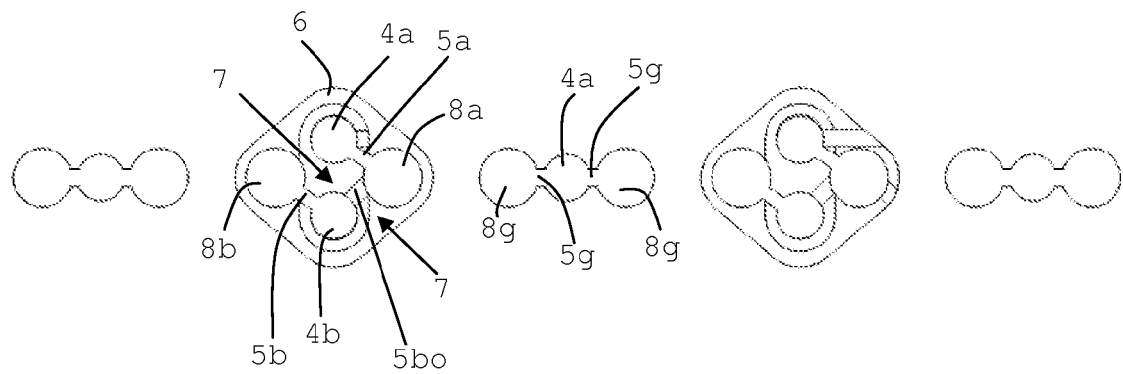
FIG. 10 is a top plan view of a portion of a one row of vias including differential pairs of contacts with additional rows of ground vias according to a preferred embodiment of the present invention.

FIG. 10 shows a via structure for a connector with only one rows of contacts. FIG. 10 shows an arrangement in which two extra rows of ground vias 1g (top and bottom) are added so that a 4-inline via arrangement can be achieved. That is, the 4-inline via arrangement is achieved by grouping signal contacts 2a, 2b with the top and bottom vias 1g in the extra rows of vias 1g, creating the G-S-S-G via structure. In FIG. 10, ground pads 8g are included in the extra rows of ground vias 1g ; however, it is possible to not use grounds pads 8g and to only use the ground vias 1g.

FIGS. 23A and 23B show a connector 10 that can be used with the via structures described above. FIG. 23A shows a top perspective view of the connector 10, and FIG. 23B shows a bottom perspective view of the connector 10. The connector 10 in FIGS. 23A and 23B is a female connector; however, the connector 10 could also be the corresponding male connector (not shown) that can mate with a female connector. By being a female connector, riser cards (not shown) can be inserted into the connector 10 instead of being mated with a corresponding male connector. A riser card is a PCB that provides electrical connections, which are typically traces, from one end of the riser card to the other end of the riser card. The ends of the riser cards not inserted into the connector 10 can then be inserted into another female connector (also not shown). The riser cards can provide, in addition to the electrical connections, passive and/or active electrical components. The connector 10 includes an array of contacts 2. Although the connector 10 shown in FIGS. 23A and 23B includes eight rows of contacts 2, it is possible to use a connector 10 with any number of rows of contacts 2. The horizontal and vertical pitches of connector 10 are preferably 50 mil; however, any other suitable pitches can be used. The connector 10 includes an array of contacts 2 that can be assigned either to a differential pair or ground.

The connector 10 can also include alignment pins 10a that help align the connector 10 when it is attached to a PCB. As shown in FIG. 23B, it is preferable that the alignment pins 10a are aligned such that the connector 10 can only be aligned one way with respect to the PCB. This can be achieved by asymmetrically aligning the alignment pins 10a on the connector 10 and/or by providing alignment pins 10a with different sizes or shapes.

The connector 10 can also include polarization portions 10b that prevent the corresponding mating connector (not shown) from mating with the connector 10 unless it is properly aligned. Any suitable polarization portions can be used, or no polarization portions can be used.

Figure 24A:
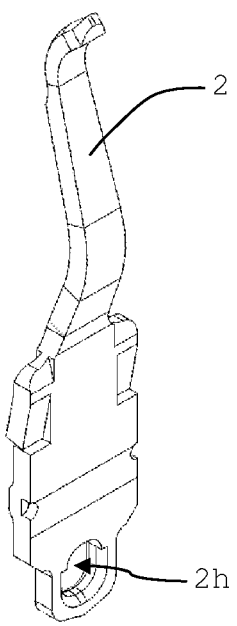
FIGS. 24A and 24B are perspective views of a contact according to a preferred embodiment of the present invention.
Figure 24B:
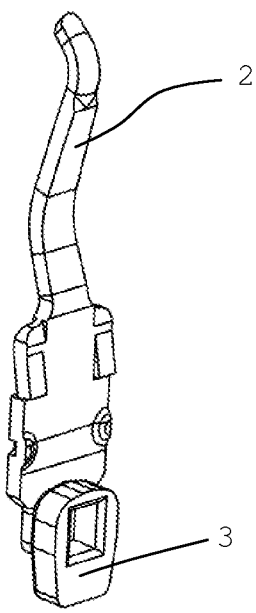

FIGS. 24A and 24B show a contact 2 that can be used with the connector 10 shown in FIGS. 23A and 24B. FIG. 24A shows the contact 2 without any solder, and FIG. 24B shows the contact 2 with the solder 3 as a solder charge. Although a solder charge is shown in FIG. 24B, it is possible to use any type solder, including crimped solder, solder balls, etc. The solder 3 is attached to the contact 2 using the hole 2h.

Figure 25:
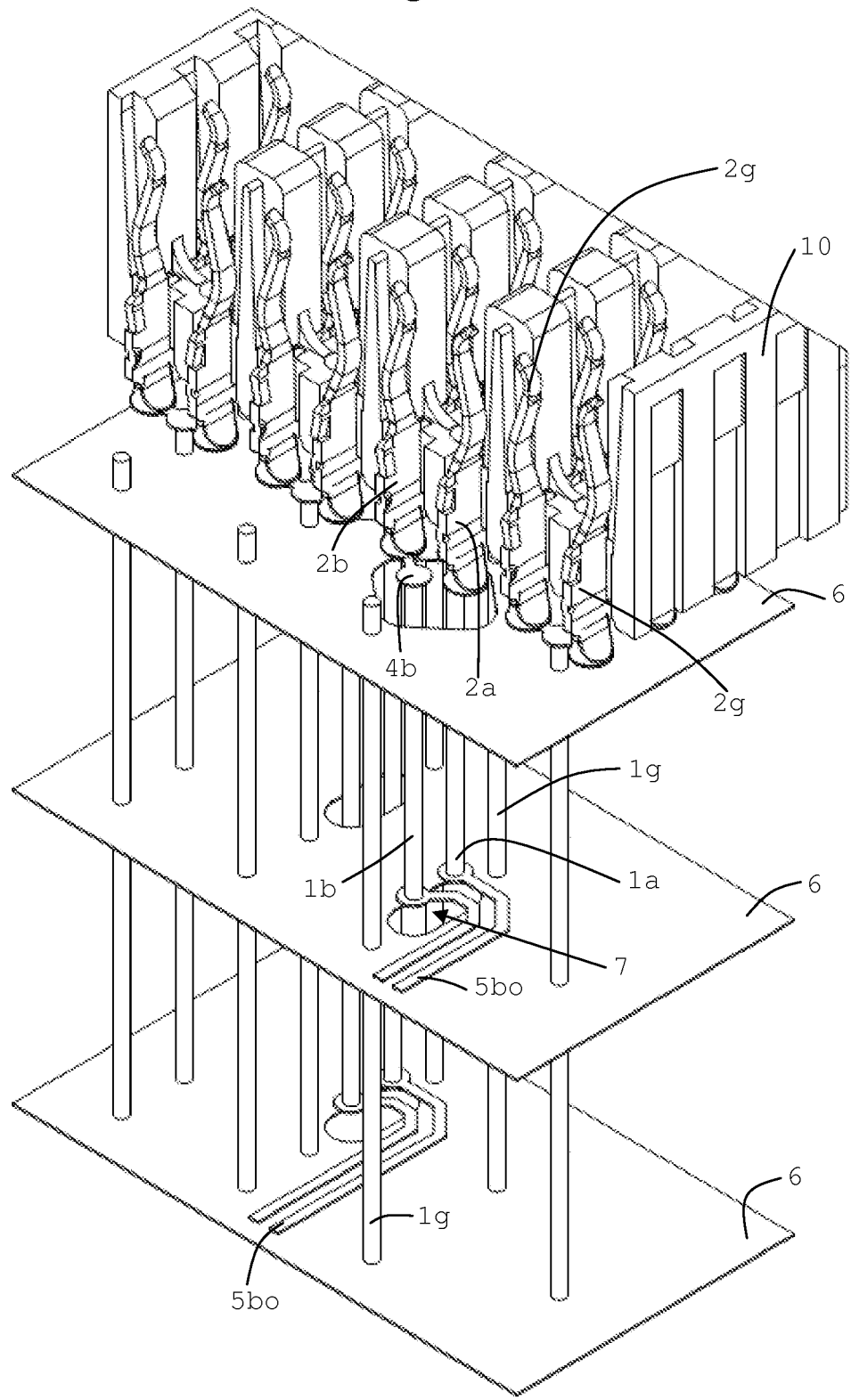
FIG. 25 is a close-up section view of a connector connected to a via structure according to a preferred embodiment of the present invention.

FIG. 25 is sectional view of the connector 10 connected to a via structure as discussed above. For simplicity, only a portion of the connector 10 is shown, and the frontmost row of contacts 2 is shown without the connector 10. Contacts 2a, 2b are connected to vias 1, 1b by pads 8a, 8b (not labeled in FIG. 25), traces 5a, 5b (not labeled in FIG. 25), and annular rings 4a, 4b (only annular 4b is labeled in FIG. 25). Two ground contacts 2g are connected to the same ground via la by pads 8a, 8b (not labeled in FIG. 25), traces 5a, 5b (not labeled in FIG. 25), and annular rings 4a, 4b (only annular 4b is labeled in FIG. 25). With the arrangement shown in FIG. 25, it is possible to transmit a differential signal between the vias 1a, 1b and the contacts 2a, 2b around a common central axis. As explained above, the differential signal is transmitted with a 90° twist as the differential signal is transmitted to and from the connector 10 and the PCB. Preferably, as shown in FIG. 25, the vias 1 are arranged in the 4-inline arrangement (G-S-S-G).

Preferred embodiments of the present invention are applicable to both lower- and higher-density pitches; their utility being more preferable in high-density pitch applications. Preferred embodiments of the present invention are also applicable to connectors including any number of rows of contacts, including connectors that include two rows of contacts or include only a single row of contacts.

The various preferred embodiments of the present invention improve the BOR and can be used with any type of riser card construction, including riser cards with coupled microstrips or striplines or with coplanar waveguide structures.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A printed circuit board comprising:
   first and second signal pads located on a top surface of the printed circuit board and arranged to transmit a first differential signal;
   first and second signal vias extending through the printed circuit board and arranged to transmit the first differential signal;
   a first signal trace located on the top surface of the printed circuit board and connecting the first signal pad and the first signal via;
   a second signal trace located on the top surface of the printed circuit board and connecting the second signal pad and the second signal via;
   first, second, third, and fourth ground pads located on the top surface of the printed circuit board and arranged to provide ground;
   first and second ground vias extending through the printed circuit board and arranged to provide ground;
   a first ground trace located on top surface of the printed circuit board and connecting the first and second ground pads; and
   a second ground trace located on the top surface of the printed circuit board and connecting the third and fourth ground pads; wherein
   the first and second signal vias are located on opposite sides of a line connecting the first and second signal pads; and
   the first differential signal includes first and second signal that are complementary to each other;
   the first signal pad, the first signal via, and the first signal trace transmit the signal;
   the second signal pad, the second signal via, and the second signal trace transmit the second signal.

2. A printed circuit board of claim 1, wherein the first and second signal vias are located on a centerline between the first and second signal pads.

3. A printed circuit board of claim 1, wherein the first and second signal vias are offset from a centerline between the first and second signal pads.

4. A printed circuit board of claim 1, further comprising third and fourth signal vias extending through the printed circuit board and arranged to transmit a second differential signal; wherein
   no ground vias are located between a first centerline between the first and second signal pads and a second centerline between the third and fourth signal pads; and
   the first and second centerlines do not overlap.

5. A printed circuit board of claim 1, further comprising a ground plane located on a layer below the top surface of the printed circuit board and including an antipad that encompasses the first and second signal pads and the first and second signal vias when viewed in plan.

6. A printed circuit board of claim 1, wherein the first and second ground vias are located on a centerline between the first and second signal pads.

7. A printed circuit board of claim 1, wherein the first and second ground vias and the first and second signal vias are located on a centerline between the first and second signal pads.

8. A printed circuit board of claim 1, wherein the first and second signal vias are arranged such that the first differential signal when transmitted through the first and second signal vias has a central axis.

9. A printed circuit board of claim 4, further comprising first and second breakout traces connected to the first and second signal vias and located on a layer within the printed circuit board and between the first and second centerlines when viewed in plan.

10. An electrical system comprising:
    a printed circuit board including:
       first and second signal pads located on a top surface the printed circuit board and arranged to transmit a first differential signal;
       first and second signal vias extending through the printed circuit board and arranged to transmit the first differential signal;
       third and fourth signal vias extending through the printed circuit board and arranged to transmit a second differential signal;
       a first signal trace located on the top surface of the printed circuit board and connecting the first signal pad and the first signal via; and
       a second signal trace located on the top surface of the printed circuit board and connecting the second signal pad and the second signal via; and
    a connector including first and second signal contacts arranged to transmit the first differential signal and including third and fourth signal contacts arranged to transmit the second differential signal; wherein
    the first and second signal vias are located on opposite sides of a line connecting the first and second pads; and
    the first differential signal includes first and second signals that are complementary to each other;
    the first signal pad, the first signal via, and the first trace transmit the first signal;
    the second signal pad, the second signal via, and the second signal trace transmit the second signal;
    the first signal contact is connected to the first signal pad;

the second signal contact is connected to the second signal pad;

no ground vias are located between a first centerline between the first and second signal pads and a second centerline between the third and fourth signal pads;

the first and second centerlines do not overlap;

the third signal contact is connected to the third signal pad; and the fourth signal contact is connected to the fourth signal pad.

11. An electrical system of claim 10, wherein the first and second signal vias are located on a centerline between the first and second signal pads.

12. An electrical system of claim 10, wherein the first and second signal vias are offset from a centerline between the first and second signal pads.

13. An electrical system of claim 10, wherein the printed circuit board further includes first and second breakout traces connected to the first and second signal vias and located on a layer within the printed circuit board and between the first and second centerlines when viewed in plan.

14. An electrical system of claim 10, wherein the printed circuit board further includes a ground plane located on a layer below the top surface of the printed circuit board and including an antipad that encompasses the first and second signal pads and the first and second signal vias when viewed in plan.

15. An electrical system comprising:

a printed circuit board including:

first and second signal pads located on the top surface of the printed circuit board and arranged to transmit a first differential signal;

first and second vias extending through the printed circuit board and arranged to transmit the first differential signal;

a first ground trace located on the top surface of the printed circuit board and connecting the first signal pad and the first signal via;

a second ground trace located on the top surface of the printed circuit board and connecting the second signal pad and the second signal via;

first, second, third, and fourth grounds pads located on the top surface of the printed circuit board and arranged to provide ground;

first and second ground vias extending through the printed circuit board and arranged to provide ground;

a first ground trace located on the top surface of the printed circuit board and Connecting the first and second ground pads; and a second ground trace located on the top surface of the printed circuit board and connecting the third and fourth ground pads; and a connector including first and second signal contacts arranged to transmit the first differential signal and first ,second, third, and fourth ground contacts arranged to provide ground; wherein the first and second signal vias are located on opposite sides of a line connecting the first and second signal pads; and the first differential signal includes first and second signals that are complementary to each other;

the first signal pad, the first signal via, and the first signal trace transmit the first signal;

the second signal pad, the second signal via, and the second signal trace transmit the second signal;

the first signal contact is connected to the first signal pad;

the second signal contact is connected to the second signal pad;

the first ground contact is connected to the first ground pad;

the second ground contact is connected to the second ground pad;

the third ground contact is connected to the third ground pad; and the fourth ground contact is connected to the fourth ground pad.

16. An electrical system of claim 15, wherein the first and second ground vias are located on a centerline between the first and second signal pads.

17. An electrical system of claim 15, wherein the first and second ground vias and the first and second signal vias are located on a centerline between the first and second signal pads.

18. An electrical system of claim 10, wherein the first and second signal vias and the first and second signal contacts are arranged such that the first differential signal when transmitted through the first and second signal vias and the first differential signal when transmitted through the first and second signal contacts share a common central axis.

* * * * *